United States Patent [19]

Lowell

[11] 4,356,881

[45] Nov. 2, 1982

[54] FLOOR SPEAKER

[76] Inventor: Benjamin W. Lowell, 45 Log Cabin Dr., Ladue, Mo. 63124

[21] Appl. No.: 237,868

[22] Filed: Feb. 25, 1981

[51] Int. Cl.$^3$ .......................... H04R 1/28; H05K 5/00

[52] U.S. Cl. .................................... 181/150; 181/155; 181/156

[58] Field of Search ........................ 181/146, 150–152, 181/155–156, 199; 179/1 E

[56] References Cited

U.S. PATENT DOCUMENTS

| | | | |
|---|---|---|---|
| 3,056,847 | 10/1962 | Breisch | 181/151 |
| 3,108,653 | 10/1963 | Valldeperas | 181/150 |
| 3,746,125 | 7/1973 | Hammes | 181/199 |
| 3,912,866 | 10/1975 | Fox | 181/155 |

FOREIGN PATENT DOCUMENTS 721732 5/1942 Fed. Rep. of Germany .

OTHER PUBLICATIONS

*Audio Engineering*, Oct. 1949, pp. 18–19.

*Primary Examiner*—L. T. Hix
*Assistant Examiner*—Thomas H. Tarcza

[57] ABSTRACT

A self-contained loud speaker for installation below the floor level is placed in an enclosure which is fitted in a hole in the floor. The bottom of the enclosure contains a jute mat and the speaker assembly is placed in the enclosure resting on the jute mat. The speaker assembly has a sound deflecting nose cone in a bottom portion and a speaker in a top portion. The sound from the speaker is directed downwardly toward the nose cone. The nose cone deflects the sound upwardly to above the floor level. A perforated baffle covers the front of the speaker and protects it from damage. The back of the speaker is covered by a can which also protects the speaker from damage. The sides of the can have louvres to permit the sound to pass out through the back of the can and to relieve back pressure on the speaker. The speaker is spaced above the nose cone by peripheral spacers at flanged edges of the baffle and the speaker can and at the flanged edge of the nose cone portion. The speaker assembly is contained in the floor enclosure. The floor enclosure has flanges which retain it in place in a floor. The floor enclosure is covered by a floor grill, which has openings to allow sound to travel through the grill to the space above the floor.

10 Claims, 3 Drawing Figures

FIG. 3.
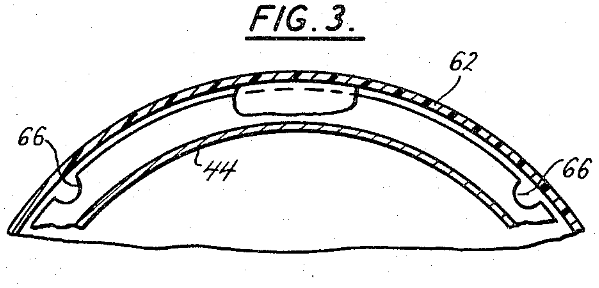
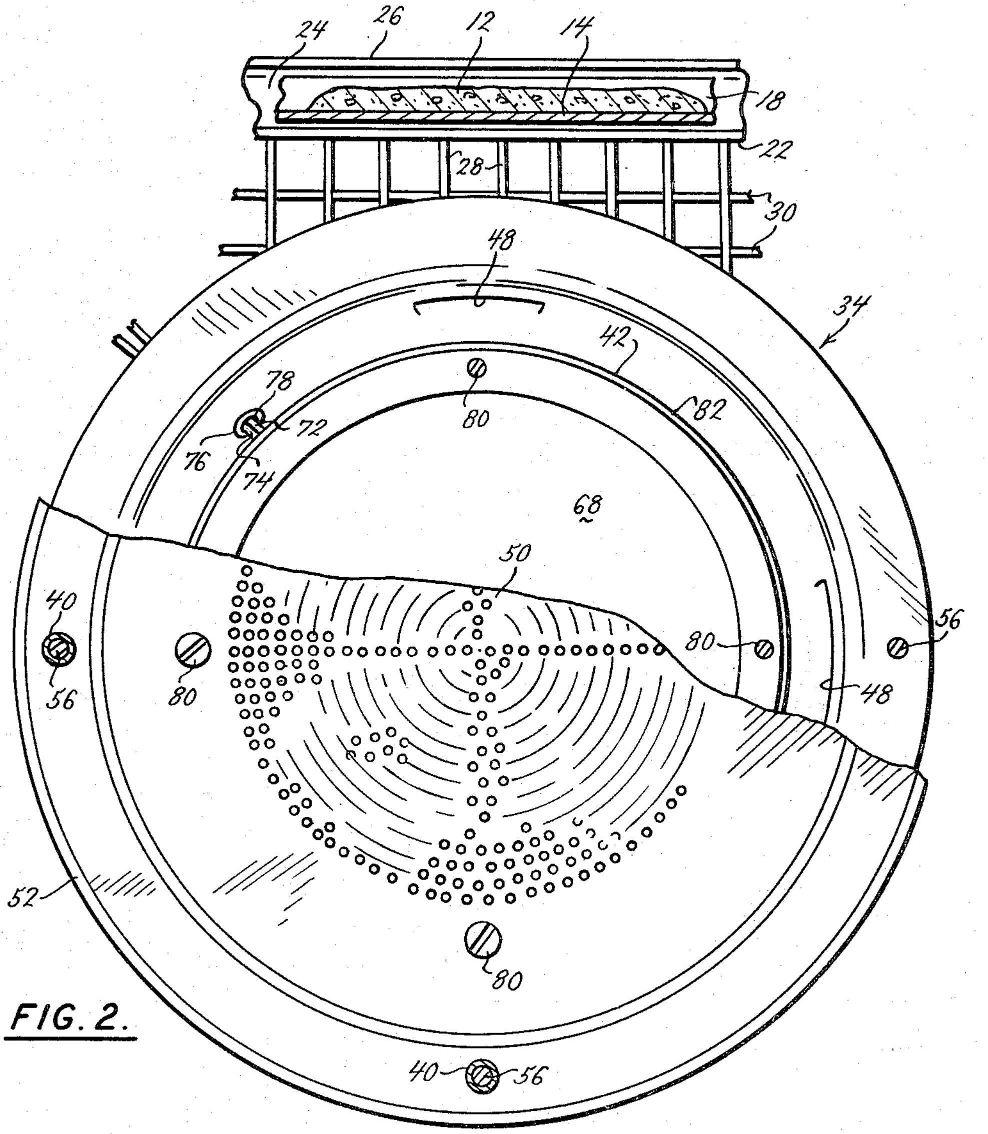
FIG. 2.

FLOOR SPEAKER

BACKGROUND AND SUMMARY OF THE INVENTION

This invention relates to loud speaker baffles and baffle assemblies, particularly those which are mounted at or below floor level. Prior U.S. Pat. No. 3,108,653, the disclosure of which is incorporated by reference herein, discloses a speaker baffle assembly which may be mounted in a floor. The speaker is connected to an imperforate portion of a floor baffle. The speaker directs the sounds downwardly to a sound deflecting nose cone which turns it 180° and directs it back through a perforate portion of the floor baffle. The nose cone is formed as an integral part of the speaker enclosure which is mounted in a hole in the floor.

Other floor or ground level mounted speakers are disclosed in German Pat. No. 721,732 of 1942 and in "Ground Loud Speakers," by David Scott, in the October, 1949 issue of *Audio Engineering,* pages 18 and 19. Both U.S. Pat. No. 3,108,653 and German Pat. No. 721,732 disclose structures which require a floor grill having an imperforate portion, which protects the speaker from damage from water or objects dropped into the assembly. The device disclosed in *Audio Engineering* uses a very expensive water proof assembly which can be operated under water. Water proof assemblies are, of course, expensive. Particularly where large numbers of the speakers are required, the cost of water proof equipment can be prohibitive. It is desirable to provide an inexpensive ground level or floor level loud speaker mounting system which provides adequate sound at an economical capital investment.

Applicant's assembly utilizes economical speaker components, yet protects them from damage or destruction caused by water or debris, when placed in a floor or ground level installation. In addition, applicant's structure is easily removable. The speaker assembly can be serviced from above the floor level without removing the surrounding enclosure from the floor. A floor grill may be used which is open to the maximum extent consistent with strength. The grill does not require imperforate portions to protect the speaker assembly beneath, thus allowing a wider distribution of sound. The speaker assembly itself is provided with a self-contained protective can which protects the speaker assembly from damage from debris and water.

The protective cover is preferably provided with relieved areas which allow the back pressure behind the speaker to be relieved. The relieved areas also transmit more of the sound generated by the speaker allowing the sound to fill a greater volume around the speaker. The speaker assembly is provided with a sound deflecting nose cone which deflects the sound from the speaker and reverses the direction 180° so the sound passes out of the enclosure into the space around the speaker. Preferably a wide angle deflection nose cone is used and it is placed close to the speaker so that a greater volume filling effect is achieved for the sound. Preferably, the speaker unit is not attached to the floor enclosure or the floor grill at all, except by resting on the bottom of the enclosure. A sound deadening means, such as a jute mat, is provided on the bottom of the enclosure to absorb any resonant vibration and to absorb minor amounts of moisture that may fall into the enclosure.

The resulting structure is a loud speaker assembly, using inexpensive components, which can be mounted beneath a floor surface in such a manner that sound is transmitted to above the floor level and fills the space around the speaker. The speaker assembly is protected from damage due to water or objects falling into the assembly from above the floor. The unit can be simply and inexpensively mounted in a hole in the floor, the entire enclosure and speaker assembly can be installed as a unit or the speaker assembly itself can be replaced or installed in a previously mounted enclosure. The speaker unit is completely beneath the floor level so that the assembly blends uniformly with the floor surface. The speaker assembly provides a reliable sound system and quality sound production.

DESCRIPTION OF THE DRAWINGS

FIG. 2 is a cross sectional view taken along the plane of lines 2—2 in FIG. 1;

FIG. 3 is a cross sectional view taken along the plane of line 3—3 in FIG. 1.

DESCRIPTION OF THE PREFERRED EMBODIMENTS

Figure 1:
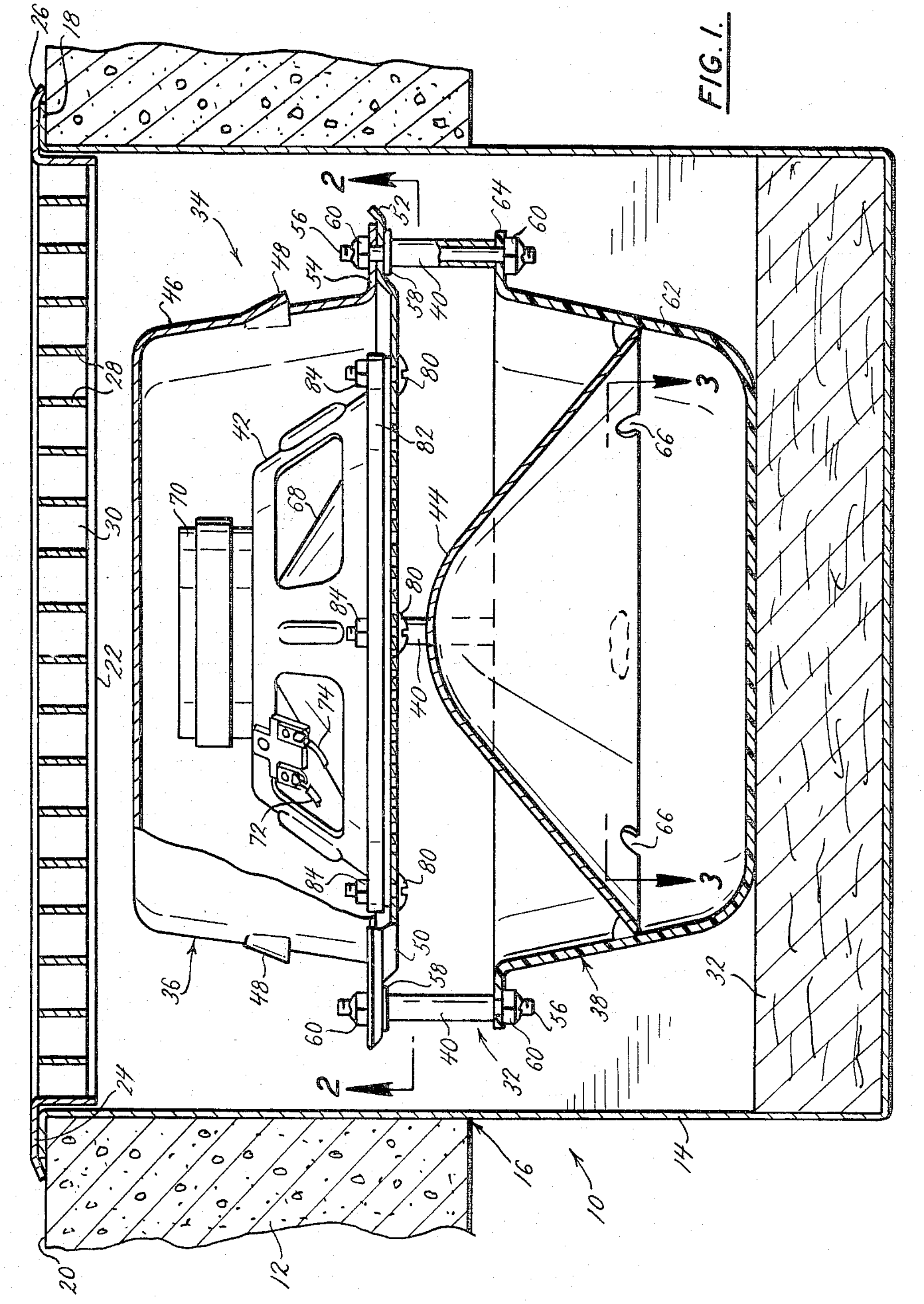
FIG. 1 is a cross sectional view of a speaker assembly and enclosure mounted in an opening in a floor.

FIG. 1 shows a speaker and baffle assembly 10 in place through a floor 12. The assembly includes an enclosure 14 in place in a hole 16 through floor 12. The enclosure 14 may be of metal, wood, plastic or other material and it may have a sound deadening material (not shown) applied to its internal or external surfaces. The enclosure 14 is retained in hole 16 by a flange 18 which rests on the upper surface 20 of the floor. The enclosure 14 and hole 16 are covered by a floor grill 22 which has a flange 24 which overlies flanges 18. Flange 24 has a angled portion 26 which forms a smooth sloping surface which blends into the surface of floor 20 to provide a smooth transition for traffic. The grill 22 may be of wood or any other suitable materials of construction, but is preferably of metal to form a strong load supporting surface. The strength of grill 22 is particularly enhanced by having the grill work formed by deep webs 28 and 30.

The bottom of the enclosure 14 is provided with a layer of packing 32, such as a jute mat of one to two inches (2.54 to 5.08 cm) thickness. The packing 32 acts as a sound deadening material to dampen resonant vibration formed in the enclosure 14. The enclosure 14 may also be provided with drain holes (not shown) which allow excess water, which accumulates in can 14 through accident or condensation to drain from the enclosure 14.

The speaker subassembly 34 is placed in the enclosure 14, as shown. The speaker subassembly 32 is formed in two sections, an upper section 36 and a lower section 38. The upper and lower sections 36, 38 are joined by spacers 40 which maintain the spacing between the speaker 42, and upper section 36, and the second deflecting nose cone 44 in lower section 38. The spacers preferably maintain the distance between the speaker, 42 in upper section 36 and nose cone 44 in lower section 38 at about two and one half inches (6.35 cm).

The upper section 36 includes a can 46 in which speaker 42 is housed. The can 46 may be formed of spun aluminum, for example, and may have louvered openings 48, as shown. A perforated baffle plate 50 covers the face of the speaker 42, as shown in FIG. 2. The baffle 50 has a flanged upturned edge 52 which mates with a flanged edge 54 on enclosure 46 to form a clam shell enclosure in which the speaker 42 is mounted. The can 46 and baffle 50 are joined through flanges 52, 54 by bolts 56 passing through spacers 40, as shown. Spacers 40 may be formed of a standard tube stock of a size to allow the bolts 56 to fit comfortably therein. Washers 58 may be placed under the spacers, as shown, and the assembly secured by nuts 60.

The lower section 38 includes a dish like base 62 which may be formed of metal or other material such as plastic, for example, high density polypropylene. The base 62 has a flanged edge 64 through which bolts 56 also pass and which are held against tubular spacers 40 by nuts 60, as shown. The base 62 contains the sound deflecting nose cone 44, as shown, which is secured in the base 62. The sound deflecting nose cone 44 has pressure relieving holes 66 near its periphery to relieve back pressure formed by resonance in the nose cone 44 when in use to deflect sound. It will be appreciated that the base 62 may also be provided with weep holes, not shown, as is conventional in the art.

The speaker 42 may be of conventional power capacity and construction, for example one to fifteen watts, having a diaphragm 68 and voice coil 70. Speaker 42 is provided with electrical leads 72, 74, as shown. The electrical leads 72, 74 pass through grommet 76 and a hole 78 in can 46 and are connected to conventional power source. Speaker 42 is held in place in upper section 36 by bolts 80 which pass through baffle plate 50 and through flange 82 on speaker 42. The bolts 80 are fixed in place by nuts 84.

Installation, Servicing and Use

It will be appreciated that the unit can be installed very simply by forming a hole in the floor, be it concrete or other material of construction and placing the entire assembly, including enclosure 14, speaker assembly 34 and grill 22 in and over the hole 16. To install, replace or service the speaker assembly, it is only necessary to lift off the grill 22 and remove the assembly 34 from the enclosure 14. This can be conveniently done since there are no mechanical connections between the speaker assembly 34 and enclosure 14. The speaker assembly 34 rests on the packing 32 at the bottom of can 14. Moreover, by the use of conventional releasable fasteners (not shown) on leads 72 and 74 the electrical connection can be easily disconnected and the entire assembly 34 can be removed from the enclosure and replaced, for example, if malfunctioning. The malfunctioning assembly 34 can be serviced at a separate location.

For purposes of illustration, an installation for a public building, such as a church, would use several one watt speakers, operating at about 0.25 watts power. The sound produced would fill a floor space of about twenty feet (6.10 meters) radius about the opening 16 and enclosure 14 to a height of five to six feet (1.5 to 1.8 meters).

Various changes and modifications in the described invention may be made, as will be readily apparent to those skilled in the art. Such changes and modifications are within the scope and teachings of this invention as defined by the claims appended hereto.

I claim:

1. A loudspeaker assembly and enclosure for floors having a speaker enclosure for installation at and below floor level, including a flat support means for attaching the enclosure to the floor surface and extending therethrough, the enclosure having a bottom and at least one wall, and means forming an opening to the interior of the enclosure, the opening being surrounded by the means for supporting the enclosure on the floor surface, the enclosure having sound absorbing means, and an open grill for covering the opening to the enclosure, the grill having a peripheral flange means for overlying the flange of the enclosure and for resting thereon, the assembly including a speaker assembly supportable on the bottom of the enclosure, the speaker assembly including a speaker, a speaker can covering the back of the speaker and a speaker baffle enclosing the front of the speaker, the speaker assembly also having a sound deflecting nose cone and a base for the sound deflecting nose cone, the nose cone being mounted in relation to the speaker so that sound projected from the speaker is deflected outwardly and reversed in direction by 180°, the speaker assembly having means spacing the nose cone and speaker in a fixed relationship.

2. The device of claim 1 wherein the speaker can has open louvers for passing sound through the can.

3. The device of claim 1 wherein the speaker can and speaker baffle have peripheral flanges and wherein the speaker baffle and speaker can are joined by bolts through the peripheral flanges.

4. The device of claim 3 wherein the speaker baffle is fastened to the periphery of the speaker frame.

5. The device of claim 3 wherein the nose cone base has a peripheral flange and wherein the nose cone and the speaker are spaced and fixed in a permanent relationship by peripheral spacers extending between the flanges of the nose cone base, the speaker baffle and the speaker can.

6. The device of claim 5 wherein the spacers are tubular sections and wherein the assembly is joined and fixed, and the nose cone and speaker are maintained in a fixed relationship, by bolts passing through the tubular spacers and through the flanges of the speaker can, the speaker baffle and the nose cone base.

7. The device of claim 1 wherein the nose cone has pressure relieving means at the periphery thereof.

8. The device of claim 1 wherein the speaker can has a hole therein for introducing electrical leads to the speaker.

9. The device of claim 1 wherein the floor grill has a down turned edge to provide a smooth transition with the floor on which the enclosure and grill are supported, the edge of the floor grill extending beyond the edge of the enclosure flange.

10. A speaker assembly for mounting below floor level comprising a speaker, a speaker can covering the back of the speaker, and a perforated speaker baffle covering the front of the speaker, the speaker can having louvered portions; the speaker having a frame terminating in a flange, the speaker being joined to the speaker baffle by fasteners extending through the speaker baffle and the speaker flange; the speaker baffle and the speaker can each having peripheral flanged portions, the speaker can and the speaker baffle being joined about the speaker in a clamshell enclosure by fasteners through the peripheral flanges; the speaker assembly having a sound reversing nose cone mounted in a nose cone base, the nose cone base forming an enclosure behind the nose cone, the nose cone base having a flanged periphery, the nose cone and nose cone base being spaced from the speaker, speaker baffle and speaker can by spacers extending between the nose cone base flange and the flanges of the speaker baffle and speaker can, the spacing being fixed by fasteners extending through the spacers and through the flanges of the nose cone base, speaker baffle and speaker can.

* * * * *